United States Patent [19]
Mahant-Shetti et al.

[11] Patent Number: 4,795,964
[45] Date of Patent: Jan. 3, 1989

[54] METHOD AND APPARATUS FOR MEASURING THE CAPACITANCE OF COMPLEMENTARY FIELD-EFFECT TRANSISTOR DEVICES

[75] Inventors: Shivaling S. Mahant-Shetti, Richardson, Tex.; Aki Nishimura, Ibaraki, Japan

[73] Assignee: Texas Instruments Incorporated, Dallas, Tex.

[21] Appl. No.: 893,054

[22] Filed: Aug. 1, 1986

[51] Int. Cl.$^4$ .......................................... G01R 27/26
[52] U.S. Cl. .............................. 324/60 C; 324/158 T
[58] Field of Search ............. 324/60 C, 60 R, 60 CD, 324/158 T, 158 D, 158 R; 364/482; 307/448, 451; 371/15; 330/2

[56] References Cited
U.S. PATENT DOCUMENTS
4,380,707 4/1983 Crisp .......................... 307/448 X

OTHER PUBLICATIONS

Iwai et al., Capacitance Measurement Technique in High Density MOS Structures, 12-1980, pp. 235-238.
Van Beers et al., Automatic Accurate Display of Capacitance-and Conductance-Versus-Bias Characteristics at High Frequencies for Semiconductor Evaluation, 3-1977, pp. 1-5.

Primary Examiner—Reinhard J. Eisenzopf
Assistant Examiner—Jack B. Harvey
Attorney, Agent, or Firm—Stanton C. Braden; James T. Comfort; Melvin Sharp

[57] ABSTRACT

A combination inverter chain and ring oscillator (200) is used to measure the capacitance of a field effect transistor device (12, 85, 202) by measuring the current associated with propagating a signal through the circuit at a certain signal frequency. Where the device (12) is a CMOS pair, the capacitance thus obtained is reduced by a constant factor to take crowbar current (52) into account. Once the capacitance for a basic or reference device (84) has been determined, the basic structure may be modified to derive incremental per-unit area capacitances for various components of the device structure.

27 Claims, 3 Drawing Sheets

METHOD AND APPARATUS FOR MEASURING THE CAPACITANCE OF COMPLEMENTARY FIELD-EFFECT TRANSISTOR DEVICES

TECHNICAL FIELD OF THE INVENTION

This invention relates in general to measuring the capacitance of semiconductor devices, and more particularly relates to methods and apparatus for measuring femtofarad levels of capacitance in very large scale integrated circuit (VLSI) devices.

BACKGROUND OF THE INVENTION

The development of complex VLSI circuits has increased the need for more circuit simulation prior to fabrication of actual operating devices. The simulation of the circuits provides accurate data on representative samples, and these data are used for models and for process development. For statistical samples, voltage-current characteristics with a better than three percent accuracy are routinely available. However, statistical data for capacitances are scarce. Such data as are available have an accuracy of only about ten percent.

One method of measuring capacitance is to use a delay observed when propagating a signal through a chain of devices. The delay is related to the RC time constant of the device, which may vary substantially due to fabrication misalignments or other effects of manufacturing. Thus, on a wafer of theoretically uniform devices, the RC time constant of a device on one edge of the wafer may be greatly different from the RC time constant of a device on an opposing edge. The precision of the measurement suffers accordingly.

In conventional VLSI circuits, the individual devices are sized on the order of fractions of microns and have capacitances in the subfemtofarad range. Direct measurements of capacitance in this range are difficult and time consuming. A need has therefore arisen in the industry for a quick and accurate method for characterizing the capacitance of VLSI devices.

SUMMARY OF THE INVENTION

The present invention discloses and claims a method and apparatus for determining capacitance of VLSI devices using combination inverter chain and ring oscillator circuits. A plurality of field-effect transistor devices are connected serially in a chain, such that a first node of each device, located on a current path thereof, is connected to at least one control electrode of the next device. A supply voltage source is connected to the first node of each device by a current path of a field-effect transistor.

In operation, an input signal is propagated through the chain of devices, and the current from the power supply drawn by the devices is measured. The capacitance is then calculated as a function of the current drawn and the frequency of the signal.

An important aspect of the invention is the provision of differential capacitive loading of the basic device. Another capacitively loaded chain of devices may be provided in addition to a basic, unloaded drain of devices, wherein each device has an added or modified element as compared to the chain of basic devices. The input signal is propagated through the chain of modified devices, and the current drawn by the devices is measured. A capacitance of the additional or modified element can be obtained by comparing the modified device capacitance with the original or basic device capacitance.

Where the device is a complementary metal-oxide-semiconductor (CMOS) pair of transistors, the above method gives capacitance values that are in general higher than those than are measured by conventional methods. As will be described in more detail below, corrected capacitance values can be obtained by applying a correction factor due to crowbar current. It has been determined that the measurement error due to crowbar current varies linearly with the total capacitance.

The circuits of the invention may be operated either as a linear inverter chain, as above described, or as a ring oscillator. Suitable circuitry is provided that selectively connects the ends of the inverter chain together and at the same time disconnects the inverter chain from the input signal source. In this condition, an input signal is propagated endlessly in a ring, with a constant delay between signal passes that is the basis for the calculation of a signal frequency. Once the frequency is known, the capacitance of the ring, and therefore each device connected therein, may be calculated, as the voltage is held constant and the supply current may be measured.

In a preferred embodiment, a combination ring oscillator and inverter chain of basic field-effect devices is formed at a face of a semiconductor body. At this same face, similar combination inverter chain and ring oscillator circuits are formed of modified or differentially loaded devices. The modified devices each are similar to the basic device. A second, modified type of device may be formed so as to be similar to the first device in all respects except that, e.g., the area of a connecting conductor may be expanded over the substrate, creating an additional increment of capacitance between the conductor and the substrate. The capacitance of each of the modified devices is compared against the capacitance of the reference device, and the relative contribution of the modified element is then ascertained. In this manner, capacitance values for each element of the device can be calculated, as well as the total capacitance for devices of small geometries.

Thus, a principal advantage of the invention is the provision of a quick method for characterization of capacitance parameters for submicron VLSI devices and elements thereof. Another principal advantage is its provision of a method to characterize small device capacitance from current and frequency measurements. Still another advantage is to provide differentially loaded inverter chains of small devices, wherein the capacitive contribution of individual device elements may be accurately ascertained. A further advantage is the provision of a method for measuring capacitance that does not depend to a large extent on the RC time constant of the device and is affected only to a secondary degree by manufacturing variances. A still further advantage is that the capacitance data thus obtained are accurate. Yet another advantage is the ability to obtain capacitance values from current and frequency measurements using both ring oscillator and inverter chain methods as applied to the same devices in a single test bar.

BRIEF DESCRIPTION OF THE DRAWINGS

A more complete understanding of the invention may be had by reference to the following detailed description when taken in conjunction with the accompanying drawings wherein.

DETAILED DESCRIPTION

Inverter chains and ring oscillators have conventionally been used to test speed performance and defect density. As will be shown below, these circuits can be advantageously used to calculate the capacitance of the devices from which they are made, and subcomponents thereof, by measurements of current and frequency.

Figure 1:
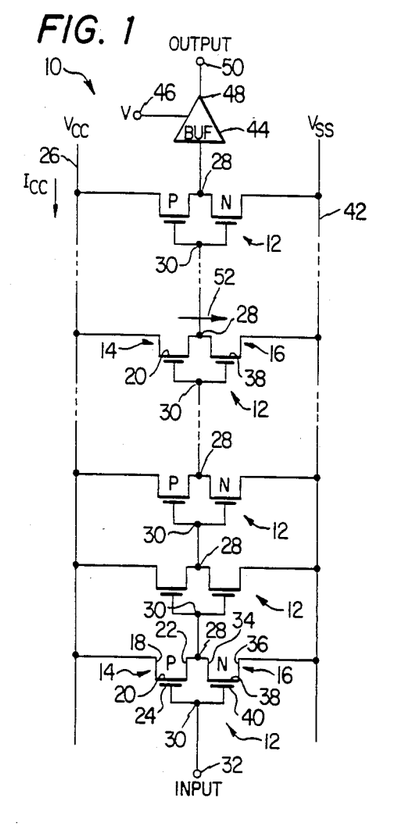
FIG. 1 is a schematic electrical diagram of an inverter chain according to the invention.

Referring to FIG. 1, an inverter chain according to the invention is indicated generally at 10. Inverter chain 10 comprises a plurality of field-effect transistor devices 12. In the illustrated embodiment, field-effect transistor devices 12 are complementary insulated gate field effect transistor devices, commonly known as complementary metal-oxide-semiconductor (CMOS) devices.

Referring to the bottommost device 12, each device 12 has a P-channel transistor 14 and an N-channel transistor 16. P-channel transistor 14 has a drain 18, a current path 20 and a source 22. The conductivity of current path 20 is controlled by a control electrode 24. Drain 18 is connected to a voltage supply source ($V_{cc}$) through lead 26. P-channel source 22 is connected to a first node 28. Control electrode 24 is connected to a node 30. In the case of the bottommost device, node 30 is connected to an input 32 where an input signal may be introduced into the circuit.

N-channel transistor 16 likewise has a drain 34, a source 36, and a current path 38. The conductivity of current path 38 is controlled by a control electrode 40, which is in turn connected to node 30. N-channel drain 34 is connected to node 28, and source 36 is connected to a grounding source ($V_{ss}$) through lead 42.

As may be seen, each succeeding device or stage 12 of the illustrated chain is identical. In the chain of FIG. 1, the node 28 of each device 12 is connected to node 30 of the succeeding device 12. In the last (uppermost) device in the chain, node 28 is connected to an output buffer 44. In order to isolate it from the circuit, output 44 has its own voltage supply 46. An output 48 of buffer 44 is connected to an output terminal 50, at which the output signal may be sensed and measured.

Each stage or device 12 in the inverter chain will invert the signal presented to its input at 30. Thus, if the first device experiences a signal of $V_{cc}$ at node 30, it will produce a signal of zero at node 28. The second device, experiencing a signal of zero, will put out a signal of $V_{cc}$, etc. The input signal is in this manner propagated through the chain until it is available at output terminal 50.

As the signal is propagated down the inverter chain, current must be supplied to charge up the capacitance of each device. The input signal in general has a fixed, predetermined frequency. Thus, the capacitance of each device in the inverter chain may be estimated by measuring the current drawn by stages 12 from $V_{cc}$ to propagate the signal. In CMOS devices, the standby current, or that current drawn from $V_{cc}$ when the signal presented to the device is not going through a transition, is negligible in relation to the active current drawn when a signal transition is experienced. Since this active current is mostly used to charge up or discharge the capacitance associated with each device in the chain, a measurement of the current can be used to calculate the total chain capacitance according to the formula I=CVf, where C is the total capacitance, I is the measured current from the supply voltage source, V is $V_{cc}$ and f is the frequency of the input signal. The capacitance of each device may be obtained by dividing the total capacitance by the number of devices in the inverter chain.

Where the tested device 12 is a CMOS pair, values thus obtained will however be high because an erroneous initial assumption is made that all of the used current is used to charge the capacitance of each device. This assumption is incorrect because a portion of the current, called the crowbar current, represented in FIG. 1 by arrow 52, shunts directly from supply voltage lead 26 to grounding lead 42 through both P-channel transistor 14 and N-channel transistor 16. This crowbar current arises because there is a period of time during transition in which both channels 20 and 38 conduct. Crowbar current 52 thus artificially inflates the value of the calculated capacitance.

Figure 2:
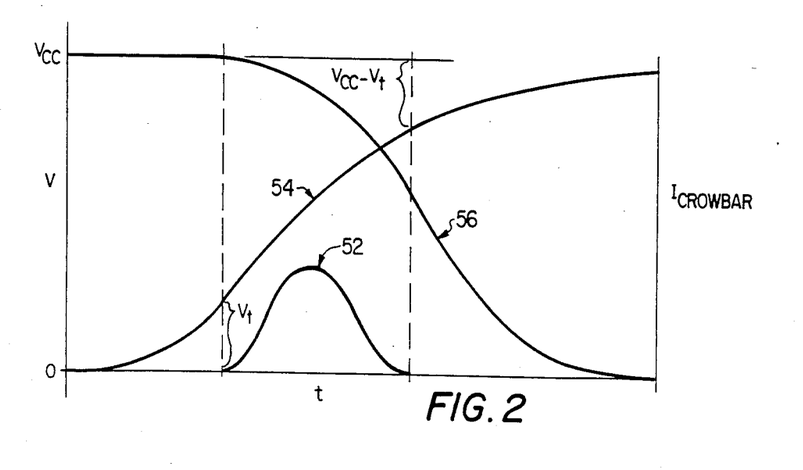
FIG. 2 is a graph of voltage and current versus time in a complementary insulated gate field-effect transistor device, showing input voltage, output voltage and crowbar current.

This effect can be more particularly explained with the aid of FIG. 2, which is a graph of voltage and current versus time. The graph illustrates a transition in which an input wave 54 changes from ground to $V_{cc}$. In CMOS devices, as input wave 54 increases, output wave 56 decreases. In region a, the input voltage 54 varies between zero and transition voltage $V_t$. In this region, P-channel transistor 14 is conducting current from $V_{cc}$ supply source 26 (FIG. 1) to node 28. N-channel transistor 16 is turned off.

When the voltage on control electrodes 24 and 40 reaches $V_t$, N-channel transistor 16 begins conducting and the current through P-channel transistor 14 begins to decrease. In region b, the N-channel transistor 16 operates in saturation, while P-channel transistor 14 operates in the linear mode. Because both current paths 20 and 38 are conducting, a crowbar current 52 (FIG. 2) passes directly from $V_{cc}$ lead 26 to grounding lead 42 (FIG. 1). As shown in FIG. 2, crowbar current 52 increases within region b as a function of the least conducting of current paths 20 (FIG. 1) and 38. As the conductivity of current path 20 begins to decrease, so will crowbar current 52 (FIG. 2). The larger the capacitance in the device, the longer will be the rise and fall times of waves 54 and 56, and thus the longer the time that crowbar current 52 can flow.

When voltage wave-form 54 incident on control electrode 24 reaches $V_{cc}-V_t$, crowbar current 52 will become zero. This point determines the boundary between Region b and Region c. In Region c, N-channel transistor 16 operates in the linear region and P-channel transistor 14 is turned off.

Crowbar current 52 diverts a portion of the charge that would otherwise charge up the capacitance of each stage 12, and thus contributes to the total measured current $I_{cc}$ delivered by power supply source 42. Since the capacitance is preferably measured as a function of the current and the signal frequency, a correction for the crowbar current is needed. It can be mathematically demonstrated that X, the ratio of the crowbar current to charging current, is as follows:

$$X = 2\left[ 4a^2 + (b - 1.5)a - \frac{35}{24} - 2.5b + \frac{5}{8}b^2 - \frac{1}{6}b^3 \right]$$

$$\left[ K' \frac{W}{L} \left( 1 - \frac{V_t}{V_{cc}} \right) \right]$$

where
$b = V_t/(V_{cc} - V_t)$,
$a = -\ln(b)$,
W = the width of the transistor channel,
L = the length of the transistor channel, and
K' is a constant relating to gate oxide thickness and the conductance of the channel region.

For the above equation, the following assumptions were made: K'(W/L) and $V_t$ are the same for both transistors; and the crowbar current is small in relation to the active current. The standby current (when no signal is propagated) has been determined to be negligible.

For a given process and design, K', $V_t$ and W/L are fixed. $V_{cc}$ is a fixed supply voltage. Therefore, the crowbar current acts like a fixed fraction of the total load capacitance for a given process and design. Any variation in K' and $V_t$ would yield a second order effect.

In general, X has been found to be about six percent from simulations by SPICE, a circuit modeling computer program licensed by the University of California at Berkeley and widely used in the industry. Therefore, the total capacitance for each stage 12, as calculated by either the linear inverter chain or the ring oscillator method of the invention, should be reduced by about six percent in order to yield an accurate value.

For an accurate $I_{cc}$ current measurement, a large number of devices 12, such as 400 devices, should be serially connected as shown in FIG. 1. The capacitance of the entire chain is calculated according to the formula I=CVf, as described above. In order to obtain a capacitance for a single device 12, the total chain capacitance is simply divided by the number of devices in the chain. Where the devices are CMOS transistor pairs, this figure is reduced by about six percent to account for crowbar current.

As mentioned, some conventional calculations of capacitance are based on a propagation delay, which is in turn dependent on the RC time constant of each device in the chain. Therefore, error will be introduced into the measurement not only by variations of C for each device, but also by any variation in the equivalent resistance of the device. On the other hand, the measuring method of the invention relies on the capacitance of the device only. It measures the total charge flowing into or out of the device capacitance, and the resulting charging current taken as an average over a period of time that is large in relation to the charge/discharge times of the capacitances involved. The method of the invention is therefore more accurate.

Not only is it important to obtain measurements for entire devices, but it is also necessary to obtain the capacitive contribution of each element in the device to the whole. These data can be obtained by building a chain of basic devices at a face of a semiconductor body per the circuit shown in FIG. 1, and in the same face form like chains of modified devices. The modified devices in each chain differ in some selected element from the basic device. In general, this selected element is added to the basic device structure so as to model the capacitive contribution of an element usually found in a VSLI device. In the following FIGS. 3a–3g, small portions of inverter chains of (FIG. 3a) basic devices and (FIGS. 3a–3g) modified devices are illustrated to show how the basic device can be modified in various ways to ascertain the capacitive contribution of a particular device element.

Figure 3A:
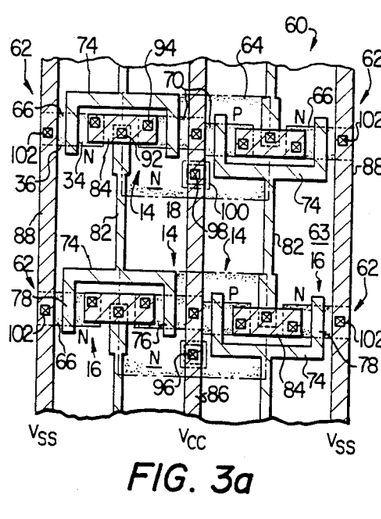
FIGS. 3a–3g are highly magnified schematic plan views of inverter chain portions comprising basic and modified devices according to the invention, showing the differential loading of these devices by elements that contribute additional capacitance.

Turning now to FIG. 3a, a small area in plan view of a test bar is shown, showing several stages of a reference or basic inverter chain 60. In one test bar fabricated according to the invention, the basic inverter chain 60 preferably has a large, known number of stages 62, such as 400 stages. The reference device structure 62 is by design the very simplest of inverter stages with a minimum of capacitance for the CMOS device employed.

In FIG. 3a, each inverter stage 62 corresponds to a CMOS stage or device 12 as shown in FIG. 1. Chain 60 is electrically connected per FIG. 1. Reference inverter chain 60 is formed in a P-type semiconductor substrate 63 having an N tank 64 diffused therein for each stage 62. For each device, an N-type region 66 is diffused in P-type substrate 63. A P-type region 70 is diffused in N tank 64.

A polysilicon gate conductor 74 is formed for each CMOS pair of transistors 14 and 16. Gate conductor 74 has a P-channel control electrode 76 at one end thereof, and an N-channel control electrode 78 at the other end. Gate conductor 74 is separated from semiconductor substrate 62 by an appropriate thickness of gate oxide (not shown) underneath electrodes 76 and 78, and is separated from the other portions of the substrate by a thicker field oxide.

At the same time that gate conductor 74 is formed, a connecting conductor 82 is deposited, and is preferably integrally formed with gate conductor 74 out of polysilicon. Like conductor 74, an intervening insulating layer (not shown) separates conductor 82 from the surface of substrate 63. Conductor 82 extends from conductor 74 across substrate 63 to connect to a preceding stage 62.

After gate conductor 74 is deposited, an insulating layer (not shown) of suitable thickness is deposited over the entire surface. Various contacts, as shall be more particularly described below, are then opened up in the surface of the insulating layer to the underlying structures.

Next, the first level metal structures are formed on top of the insulating layer, including a current path connecting conductor 84 for each stage 62, one $V_{cc}$ rail 86 for two columns of stages 62, and one $V_{ss}$ rail 88 for two columns of stages 62. Connecting conductor 84 extends into a contact 90 to the drain 34 of N-channel transistor 16, and makes contact at 92 with poly conductor 82. Conductor 84 further extends into a contact 94 to the source 22 of P-channel transistor 14.

$V_{cc}$ rail 86 contacts P-channel drain 18 at 96. The $V_{cc}$ rail 86 also contacts tank region 64 at contact 98. This is to allow proper operation of P-channel transistor 14, as a zero voltage differential should exist between diffused region 70 and tank 64 for P-channel transistor to conduct. An N+ diffusion 100 is formed in tank 64 at this point to prevent the formation of a diode. For each stage 62, $V_{ss}$ rail 88 makes a contact at 102 to the source 36 of N-channel transistor 16.

Figure 3B:
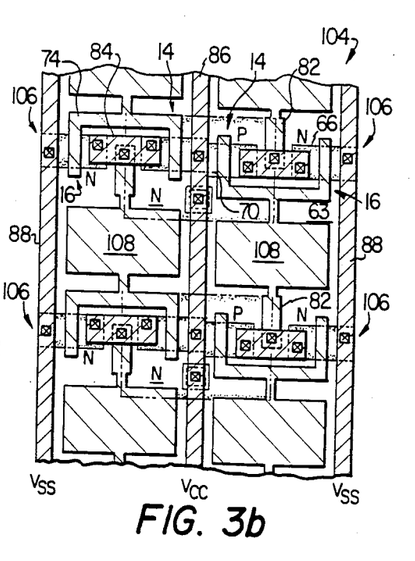

Turning now to FIG. 3b, a first variation on basic inverter chain 60 is shown at 104. Inverter chain 104, like the remainder of the inverter chains herein described, is preferably formed in the same semiconductor test bar as reference chain 60. Chain 104 is comprised of a plurality of identical stages 106, which are identical in formation and connection to basic stage 62 (FIG. 3a), except for certain selected modified elements. Preferably, the same number of stages are used in each modified or differentially loaded chain as are used in basic chain 60.

In each stage 106, poly conductor 82 has been widened by a predetermined amount to include a rectangular area 108. Area 108 is spaced from substrate 63 by an appropriate thickness of insulator (not shown). Area 108 is preferably formed integrally with conductor 82, and is spaced sufficiently from tank 64 and transistors 14 and 16 to prevent any significant capacitive interaction therewith. Chain 104, as including stages 106, is provided to calculate an incremental capacitance between gate conductor 82 and semiconductor body 63.

Figure 3C:
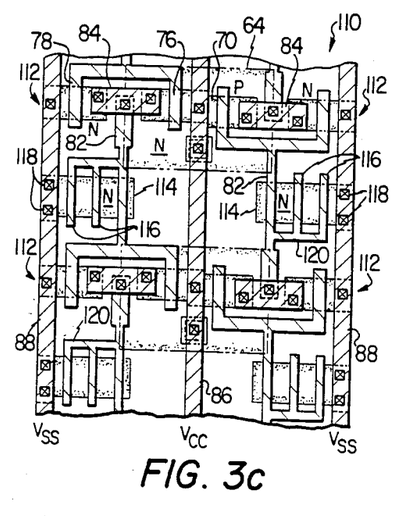

Referring to FIG. 3c, another modified inverter chain 110 is shown. Chain 110 is comprised of a plurality of modified stages or devices 112. Each stage 112 is similar to a basic stage 62 (FIG. 3a) with the following additional elements. An N-type moat 114 is diffused into substrate 63. A plurality of second gate conductors 116 are formed across moat 114, and spaced therefrom by a suitable gate insulating layer (not shown). Second gate conductors 116 are each formed such that their length dimension greatly exceeds their width dimension. In this manner, the shape of gate 78 is approximated, and the capacitive contribution of gate 78 in relation to region 66 is modeled. Narrow conductors 116 are used to obtain fringing effects that would not be as important in a conductor of greater width. To complete stage 112, moat 114 is connected to $V_{ss}$ rail 88 by a pair of contacts 118. Conductors 116 are connected to conductor 82 via a conductor 120, and preferably conductors 82, 116 and 120 are integrally formed out of polysilicon.

Figure 3D:
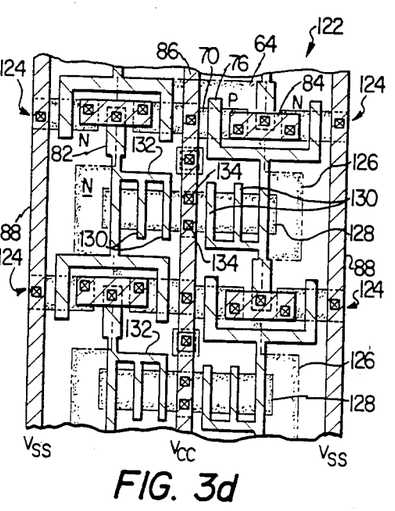

Turning now to FIG. 3d, an inverter chain 122 of modified devices is shown that is related in its modifications to chain 110 (FIG. 3c). Inverter chain 122 is comprised of a plurality of stages 124, each of which has been designed to model the contribution to device capacitance made by gate 76 in relation to P diffusion region 70. N tank 64 has been modified to include a tank region 126. A P moat 128 is diffused into the center of region 126 to correspond to P diffused region 70. After the deposition of a suitable gate insulator (not shown) over moat 128, a plurality of second gate conductors 130 are formed to extend over moat 128, thus corresponding to P gate electrode 76. Like second gate conductors 116 in FIG. 3c, conductors 130 are made narrow to model the fringing effects attendant on a FET gate. A conductor 132 connects conductors 130 to conductor 82, and it is preferred that conductors 82, 130 and 132 be integrally formed of polysilicon. Moat 128 is connected to $V_{cc}$ rail 86 via contacts 134.

Figure 3E:
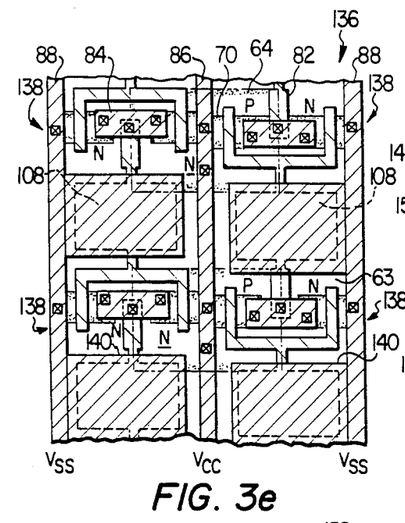

Referring now to FIG. 3e, an inverter chain 136 of modified devices is partially shown that is related in its modifications to chain 104 (FIG. 3b). In fact, the two chains 104 and 136 are used in conjunction to model the capacitive contribution of first-level metal with respect to poly conductor 82.

Like stages 106 (FIG. 3b), each stage 138 of chain 136 has an extended area 108 of poly conductor that is preferably integrally formed with conductor 82. Area 108 is spaced from substrate 63 by an insulator layer. A conductive layer 140 is formed to integrally extend over area 108. Layer 140 is preferably an integral extension of $V_{ss}$ rail 88, and is spaced from layer 108 by a suitable insulator layer (not shown).

A signal propagated through chain 136 will cause an $I_{cc}$ current due to (1) the capacitance of area 108 with respect to substrate 63 plus (2) the capacitance due to the interaction of area 108 with layer 140. Capacitance (1) is obtained from chain 104 (FIG. 3b), and capacitance (2) may therefore be calculated by subtracting capacitance (1) from the total per-device capacitance measured for this modification.

Figure 3F:
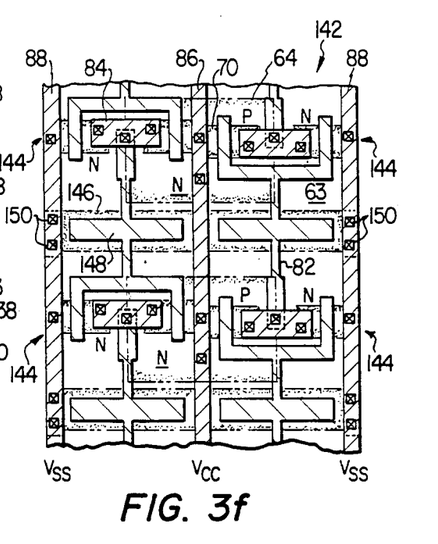

Referring now to FIG. 3f, a portion of another differentially loaded chain 142 is illustrated. In addition to the basic structure, each stage 144 of chain 142 has a P-moat 146 formed in an area of substrate 63 spaced from N tank 64. A rectangular area 148 of polysilicon extends integrally from conductor 82 over moat 146. Area 148 and moat 146 are spaced by a suitable insulative layer, preferably field oxide. Moat 146 is connected to $V_{ss}$ rail 88 by contacts 150.

Inverter chain 142 is provided to model the contribution to device capacitance of conductor 82 to region 70, as excluding the effects of fringing and N tank 64.

Figure 3G:
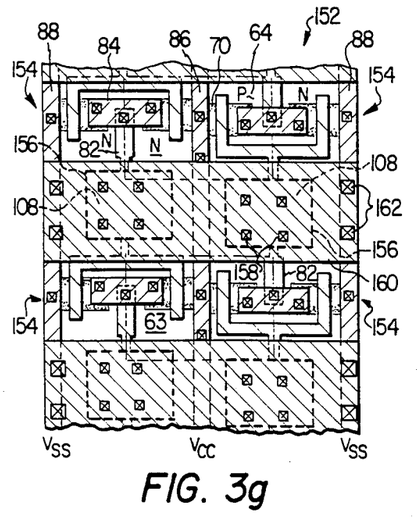

Referring next to FIG. 3g, a portion of an inverter chain 152 is shown that is provided to model the effects of second level metal. Chain 152 is related in its modifications in form to chains 104 (FIG. 3b) and 136 (FIG. 3e).

For each modified stage 154 of chain 152, a rectangular polysilicon area 108 is provided that extends over and is spaced from an area of substrate 63. Area 108 is preferably integrally formed with conductor 82. An insulator layer (not shown) is next deposited over layer 108, and then a first level metal layer 156 is formed to extend over area 108. A plurality of contacts 158 are formed to electrically connect area 108 and layer 156. A further insulative layer (not shown) is formed on layer 156, and then a second level metal layer 160 is formed over this insulative layer. Layer 160 is connected to $V_{ss}$ rails 88 by vias 162.

Area 108 and metal layer 156 are electrically joined by contacts 158. The contribution of area 108 and layer 156 to node capacitance will be zero. The incremental capacitance of the illustrated structure will therefore be the sum of (1) the capacitance between area 108 and substrate 63, plus (2) the capacitance between layer 156 and layer 160. Since capacitance (1) can be obtained from chain 104 (FIG. 3b), capacitance (2) can be calculated by subtracting the known capacitance (1) from the total measured capacitance for each stage 154.

Figure 4:
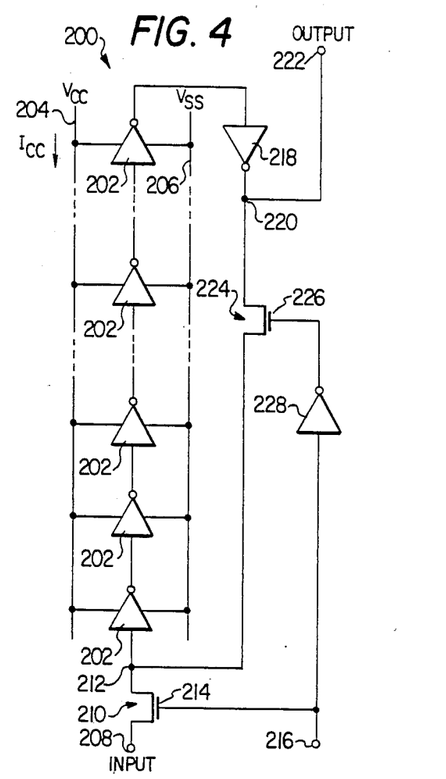
FIG. 4 is an electrical schematic diagram of a combination inverter chain and ring oscillator according to the invention.

Turning now to FIG. 4, a combined inverter chain and ring oscillator according to the invention is indicated generally at 200. Ring oscillator 200 comprises a series of inverter stages 202, each of which correspond to a CMOS transistor pair 12 as shown in FIG. 1, and also one of stages 62, 106, 112, 124, 138, 144 or 154 shown in FIGS. 3a–3g. Inverter stages 202 are connected serially in the manner shown in FIG. 1. Each inverter stage 202 is connected in common to a supply voltage source or $V_{cc}$ 204, and to a grounding source or $V_{ss}$ 206. An input terminal 208 is connected via a switching transistor terminal 208 is connected via a switching transistor 210 to a node 212. Node 212 is in turn connected to the input of a first inverter stage 202. Switching transistor 210 has a control electrode 214 that is connected to a switching signal terminal 216.

The last of the inverter stages 202 has an output that is connected to a ring buffer 218. Ring buffer 218 is analogous to buffer 44 of FIG. 1, and has its own voltage supply (not shown) to isolate the ring oscillator. The output of ring buffer 218 is connected to a node 220. Node 220 is in turn connected to an output terminal 222 and also selectively to node 212 through a second switching transistor 224. Switching transistor 224 has a control electrode 226 that is connected to the output of an inverter 228. The input of inverter 228 is connected to switching signal terminal 216.

Ring oscillator 200 may thus operate as either a linear inverter chain or a ring oscillator, depending on the value of switching signal S. If switching signal S is such that control electrode 214 is energized, then control electrode 226 will not be energized. Therefore, transistor 210 will be on and transistor 224 will be off. This condition configures the circuit into the inverter chain shown in FIG. 1. If switching signal S takes the opposite value, transistor 210 will be off and transistor 224 will be on. In this condition, circuit 200 operates as a ring oscillator, with a signal being continuously propagated around the ring formed by the connection between nodes 220 and 212. Each passage of a voltage signal by node 220 can be sensed at output terminal 222.

There are advantages to each configuration of the circuit shown in FIG. 4. As configured as an inverter chain, a rail-to-rail propagated signal will be sensed at output pad 222. The capacitance of the inverter chain in this configuration is measured as a function of the supply current drawn by the chain and a predetermined frequency of the propagated signal. The current attributed to buffer 218, which is preferably three or another odd number of inverter stages so as to cause a reversal in polarity of the signal at each pass in the ring configuration, is obtained from a stand-alone block in order to segregate out the effect of the buffer. Where the tested device is a CMOS device, the derived capacitance is reduced by about 6% to take the crowbar current into account. This configuration may also be used in conjunction with a periodic forcing function with frequency f as an input signal.

As configured as a ring oscillator, an accurate value for a selected frequency f can be ascertained. As in the linear configuration, capacitance is derived from the equation $I = CVF$, where V is held constant and I and f are measured. A high-speed digital tester, such as a Sentry 20 tester, can be used to measure the delay in propagating the signal around the ring, which can then be used to derive the frequency. In a graph of C versus f, a point can be calculated with high accuracy and a straight line drawn from there through the origin. Other points on the line can be applied by operating the circuit in the linear configuration mode. Since I will include a crowbar current component for CMOS devices, the derived capacitance is reduced by a constant factor such as 6%. This will cause an I/f line with a slope reduced by 6%.

In a preferred embodiment, each of the inverter chains illustrated in FIGS. 3a–3g are connected according to the circuit 200 shown in FIG. 4 on a single test bar, to form seven combination inverter chain/ring oscillator circuits. The $V_{ss}$, $V_{cc}$, input signal and S signal are shared among all inverter chains. Data can thus be simultaneously acquired for all of the differentially loaded inverter chains, and the incremental capacitance from various device elements can be quickly ascertained.

In summary, a method and apparatus has been disclosed for the quick determination of very large scale integrated circuit device capacitance. By propagating a signal through an inverter chain or through a ring oscillator, the capacitance of the entire circuit and thus each stage thereof can be determined. Where the stage being tested is a CMOS inverter, a more accurate figure for the capacitance can be obtained by deducting a constant factor for the crowbar current. When the capacitance for a basic or reference inverter chain has been determined, the capacitances of altered inverter chains can be used in order to obtain the incremental capacitance of specific device elements. In this way, a quick and accurate characterization of the capacitance of each subcomponent of the device can be ascertained. Finally, a combination inverter chain/ring oscillator circuit has been disclosed that allows the switching over from an inverter chain operation to a ring oscillator mode at will, further easing subfemtofarad capacitance measurements.

While the present invention has been described with the aid of specific illustrated embodiments thereof, it will be understood that various changes, substitutions and modifications are capable of being made, and such substitutions and modifications fall within the spirit and scope of the invention as defined by the appended claims.

What is claimed is:

1. Apparatus for measuring the capacitance inside a complementary field-effect transistor circuit, comprising:
   a plurality of first complementary field-effect transistor devices connected in series, said plurality of first devices including an input and an output;
   a signal source coupled to said input for providing a signal;
   a plurality of second complementary field-effect transistor devices, including an input and an output, connected in series, each differing from said first field-effect transistor devices in that each second device is connected to at least one additional load element;
   a supply voltage source connected to said devices, said supply voltage enabling said devices to propagate said signal;
   a meter for measuring a current required to propagate said signal through said devices from said input to said output;
   a first capacitance of said transistor circuit derived from a measurement of a current drawn by said plurality of first transistor devices in propagating a signal therethrough; and
   a second capacitance of said circuit derived from a current drawn by said plurality of second devices in propagating a signal therethrough, the contribution of said additional element to said second device capacitance calculated by using the first capacitance and the second capacitance.

2. The apparatus of claim 1, wherein said first devices are connected in a first ring and said second devices are connected in a second ring, the output of any device coupled to the input of a next device;
   a first one of each plurality of said first and second devices including an input, a first switch coupling the last said input to said signal source;

a second switch inserted in each said ring to selectively open or close each said ring;

a control coupled to said first and second switches, said control operating said switches in opposed fashion, such that said apparatus can be selected either to operate so as to ascertain capacitance by measuring a current and frequency due to a delay in propagating the signal around a selected ring or to operate in a linear chain configuration to ascertain capacitance by introducing a signal of a predetermined frequency at said input and measuring a current drawn by said devices in transmitting the signal to said output.

3. The apparatus of claim 2, further comprising a buffer inserted in each said ring, said buffer comprising an odd number of inverter stages.

4. The apparatus of claim 2, wherein said linear configuration can be used to ascertain capacitance by introducing said signal into said input and measuring a delay in propagating the signal to said output.

5. The apparatus of claim 1, wherein each said device comprises a pair of complementary insulated gate field-effect transistors having current paths connected in series.

6. The apparatus of claim 5, wherein said devices are formed at a face of a semiconductor body, each said device comprising:

an N-channel insulated gate field-effect transistor having a gate, a current path, a source and a drain, said drain connected to a first node by a first conductor;

a P-channel insulated gate field-effect transistor having a gate, a current path, a source and a drain, said P-channel source connected to said first node by said first conductor;

each said gate formed from a gate conductor overlaying and spaced from each current path, said P-channel transistor gate connected through said gate conductor to said N-channel transistor gate;

a third conductor connecting said first node of each device except said last device to the gate conductor of a next device, said P-channel transistor drain connected to a supply voltage source, said N-channel transistor source connected to ground.

7. The apparatus of claim 1, wherein said first and second devices number about 400.

8. The apparatus of claim 4, wherein said plurality of first field effect transistor devices and said plurality of second transistor devices are formed at a face of a semiconductor body, said second transistor devices connected in a manner similar to said first devices and differing from said first transistor devices in at least one selected element that alters the total capacitance of said second devices relative to said first devices;

a second capacitance of said second device calculated from either a signal current and a predetermined signal frequency in propagating a signal through said second devices in the chain configuration or from a frequency due to delay in propagating the signal around the ring and the signal current in a ring configuration, the contribution of capacitance from said at least one element calculated from the capacitance of the first devices and the capacitance of the second devices.

9. The apparatus of claim 8, wherein said at least one element comprises an area of conductive material formed over and spaced from said face, said area connected to said third conductor, said area used to calculate the capacitance of said gate conductor with respect to said body.

10. The apparatus of claim 9, wherein said area, said gate conductor and said third conductor comprise an integral polysilicon conductor.

11. The apparatus of claim 9, wherein each said second devices further comprises a first conductive layer connected to and extending over said area, a second conductive layer spaced from and extending over said first conductive layer, wherein the capacitance of said second conductive layer with respect to said first conductive layer is calculated.

12. The apparatus of claim 11, wherein said first and second conductive layers comprise metal.

13. The apparatus of claim 8, wherein said at least one element comprises a moat of a certain conductivity type formed in said body and spaced from said transistors, at least one second gate conductor having a length dimension several times a width dimension thereof extending over and spaced from said moat, said second gate conductor connected to said third conductor, such that the capacitance of said second gate conductor with respect to said moat is calculated.

14. The apparatus of claim 13, wherein each said second devices further comprises a tank region of a conductivity type opposite to said certain conductivity type, said tank region surrounding said moat.

15. The apparatus of claim 13, wherein said second gate conductor, said third conductor and said gate conductor comprise an integral portion of polysilicon.

16. The apparatus of claim 8, wherein said at least one element comprises an area of conductive material extending over and spaced from said face, said area spaced from said transistors and connected to said third conductor, a conductive layer extending over and spaced from said area, such that the capacitance between said area and said conductive layer is calculated.

17. The apparatus of claim 16, wherein said area comprises polysilicon and said conductive layer comprises metal.

18. The apparatus of claim 8, wherein said at least one further element comprises a moat of a certain conductivity type formed in said body at a location spaced from said transistor, an area of conductive material extending over and spaced from said moat, said area connected to said third conductor, such that the capacitance between said area and said moat is calculated.

19. The apparatus of claim 18, wherein said area comprises polysilicon.

20. A method for measuring capacitances inside a complementary field effect transistor circuit comprising:

exciting a series of inverter chains with a signal of a predetermined frequency, each chain including both a series of complementary field effect transistor inverters and a set of loads, each load of a set being attached to an associated complementary field effect transistor inverter in its inverter chain;

measuring the current through each inverter chain;

adjusting the measured current by a correction factor corresponding to a crowbar current; and calculating the capacitive load at each inverter chain from the values of the adjusted measured current and the predetermined frequency.

21. The method as recited in claim 20 wherein the inverter chain series further includes one inverter chain wherein each load from its set of loads is of a first predetermined value and wherein the values of the loads from the set of loads of the remaining complementary field effect transistor inverter chains are additively derived from the first predetermined load value.

22. The method as recited in claim 21 wherein the calculated capacitive loads are selectively subtracted from one another to indicate the capacitances of elements within the loads.

23. A method as recited in claim 20 wherein the correction factor is derived from about six percent of the capacitive load calculated using the measured current and the predetermined frequency.

24. A method as recited in claim 20 wherein the correction factor is derived from a fixed fraction of the capacitive load calculated using the measured current and the predetermined frequency.

25. A method as recited in claim 20 wherein the correction factor is derived from a second order of a fraction of the capacitive load calculated using the measured current and the predetermined frequency.

26. An apparatus for measuring capacitances inside a complementary field effect transistor circuit comprising:

a series of inverter chains, each chain including an input and an output in addition to a series of complementary field effect transistor inverters and a set of loads, each load of a set being attached to an associated complementary field effect transistor inverter in its inverter chain, the inverter chain series further including one inverter chain wherein each load from its set of loads is of a first predetermined value and wherein the values of the loads from the set of loads of the remaining complementary field effect transistor inverter chains are incrementally above the first predetermined value;

a signal source means, coupled to the chain inputs, for providing a signal of a predetermined frequency;

a supply voltage means, connected to the inverter chains, for enabling the chains to propagate the signal; and a meter means, connected to the chains' outputs, for measuring a current required to propagate the signals through the chains whereby capacitances within the chains are calculated based on the signal frequency and relative values of measured current in the chains.

27. A method for measuring capacitances inside a complementary field effect transistor circuit comprising:

exciting a series of inverter chains with a signal, each chain including both a series of complementary field effect transistor inverters and a set of loads, each load of a set being attached to an associated complementary field effect transistor inverter in its inverter chain;

measuring the frequency of the signal;

measuring the current through each inverter;

adjusting the measured current by a correction factor corresponding to a crowbar current; and calculating the capacitive load at each inverter chain from the values of the adjusted measured current and the predetermined frequency.

* * * * *

UNITED STATES PATENT AND TRADEMARK OFFICE
CERTIFICATE OF CORRECTION

PATENT NO. : 4,795,964

DATED : January 3, 1989

INVENTOR(S) : Shivaling S. Mahant-Shetti, et al.

It is certified that error appears in the above-identified patent and that said Letters Patent is hereby corrected as shown below:

In the Abstract:

On line 3, delete reference numeral "85" and insert numeral "84".

Signed and Sealed this

Eighteenth Day of July, 1989

Attest:

DONALD J. QUIGG

Attesting Officer

Commissioner of Patents and Trademarks